(12) United States Patent
Kim

(10) Patent No.: US 9,762,784 B2
(45) Date of Patent: Sep. 12, 2017

(54) CAMERA MODULE HAVING A HOUSING COUPLING A PRINTED CIRCUIT BOARD (PCB) AND AN ACTUATOR

(71) Applicant: LG INNOTEK CO., LTD., Seoul (KR)

(72) Inventor: Young Hwan Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/904,076

(22) PCT Filed: Jul. 11, 2014

(86) PCT No.: PCT/KR2014/006237
§ 371 (c)(1),
(2) Date: Jan. 8, 2016

(87) PCT Pub. No.: WO2015/005712
PCT Pub. Date: Jan. 15, 2015

(65) Prior Publication Data
US 2016/0173744 A1    Jun. 16, 2016

(30) Foreign Application Priority Data

Jul. 12, 2013   (KR) .......................... 10-2013-0081965

(51) Int. Cl.
*H04N 5/225* (2006.01)
*H04N 5/232* (2006.01)
(Continued)

(52) U.S. Cl.
CPC ............ *H04N 5/2253* (2013.01); *G02B 7/08* (2013.01); *G03B 3/10* (2013.01); *G03B 17/02* (2013.01);
(Continued)

(58) Field of Classification Search
CPC .................................................... H04N 5/2253
(Continued)

(56) References Cited

U.S. PATENT DOCUMENTS

2009/0085138 A1*  4/2009  Ryu .................... H01L 25/50
                                                                257/434
2012/0147258 A1    6/2012  Park
(Continued)

FOREIGN PATENT DOCUMENTS

KR    10-2012-0045846 A    5/2012
KR    10-2012-0061562 A    6/2012
(Continued)

OTHER PUBLICATIONS

International Search Report dated Oct. 16, 2014 issued in Application No. PCT/KR2014/006237.

*Primary Examiner* — Joel Fosselman
(74) *Attorney, Agent, or Firm* — KED & Associates, LLP

(57) ABSTRACT

A camera module, according to one embodiment of the present invention, comprises: a printed circuit board having an image sensor provided thereon; a housing which protects the image sensor and is coupled to the printed circuit board; an actuator unit arranged on the housing; and a conductive pattern formed on a surface of the housing, wherein the actuator unit comes into contact with and is coupled to the upper part of the housing so as to be electrically connected to the printed circuit board through the conductive pattern.

16 Claims, 5 Drawing Sheets

(51) Int. Cl.
*G03B 3/10* (2006.01)
*G03B 17/02* (2006.01)
*H01L 27/146* (2006.01)
*G02B 7/08* (2006.01)

(52) U.S. Cl.
CPC ..... *H01L 27/14618* (2013.01); *H04N 5/2254* (2013.01); *H04N 5/2257* (2013.01); *H04N 5/23248* (2013.01); *G03B 2205/0069* (2013.01)

(58) Field of Classification Search
USPC ........................................................ 348/340
See application file for complete search history.

(56) References Cited

U.S. PATENT DOCUMENTS

2012/0230664 A1* 9/2012 Pavithran ............ H04N 5/2253
  396/89
2014/0092296 A1* 4/2014 Han .................... H04N 5/2257
  348/373

FOREIGN PATENT DOCUMENTS

KR 10-2012-0129784 A 11/2012
KR 10-2013-0030062 A 3/2013

* cited by examiner

CAMERA MODULE HAVING A HOUSING COUPLING A PRINTED CIRCUIT BOARD (PCB) AND AN ACTUATOR

This application is a U.S. National Stage application of international application PCT/KR2014/006237, filed in Korea on Jul. 11, 2014, which designates the United States, and which claims the benefit of the Korean Patent Application Number 10-2013-0081965, filed on Jul. 12, 2013, the disclosure of which is incorporated by reference herein in its entirety.

BACKGROUND

Field of the Disclosure

The present disclosure relates to a camera module.

Discussion of the Related Art

Conventional technology such as VCM (Voice Coil Motor) used in general camera modules is difficult to be applied to subminiature and low power consuming camera modules. Thus, relating researches have been actively conducted.

Recently, a camera module capable of performing auto focusing operation using an actuator has been developed, so that the value of subminiature, low power consuming and highly efficient camera module is being demonstrated. In order to drive an actuator, an AF (Auto Focus) terminal and a PCB AF (Auto Focus) pad at both electrodes are required to be electrically connected to control the actuator.

In particular, a complex process to connect the electrodes as described in the above is required, when a micro actuator is used for miniaturization of the camera module.

SUMMARY OF THE DISCLOSURE

One purpose of the present disclosure is to provide a camera module having advanced structure so as to include at least one of auto focus function and handshake prevention function.

In order to achieve such purposed as described in the above, in a general aspect of the present disclosure, there is provided.

According to an exemplary embodiment of the present disclosure, the actuator is coupled by being electrically connected to the substrate, so that the substrate coupled with the actuator can be mounted on a wiring formed on a surface of the camera module body. Therefore, the assembly process may become much more convenient.

In addition, according to an exemplary embodiment of the present disclosure, any complex connection structure is not required, because a wiring for each functional control can be formed at a surface of the housing when the actuator is configured to perform at least one of the auto focus function and the handshake prevention function.

DETAILED DESCRIPTION

Hereinafter, an exemplary embodiment of the present disclosure will be described with reference to the drawings.

Figure 1:
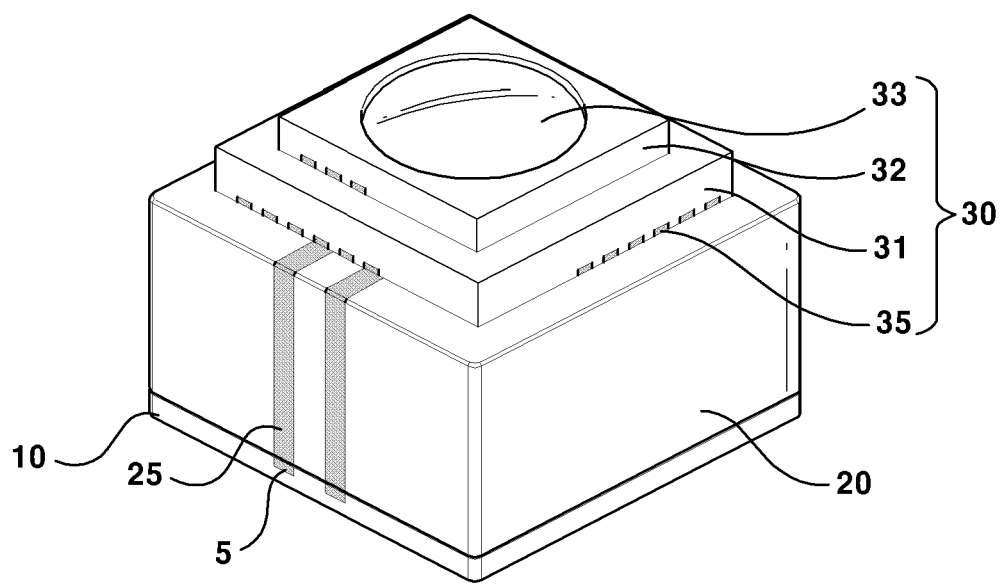
FIG. 1 is a schematic perspective view illustrating a camera module according to an exemplary embodiment of the present disclosure.
Figure 2:
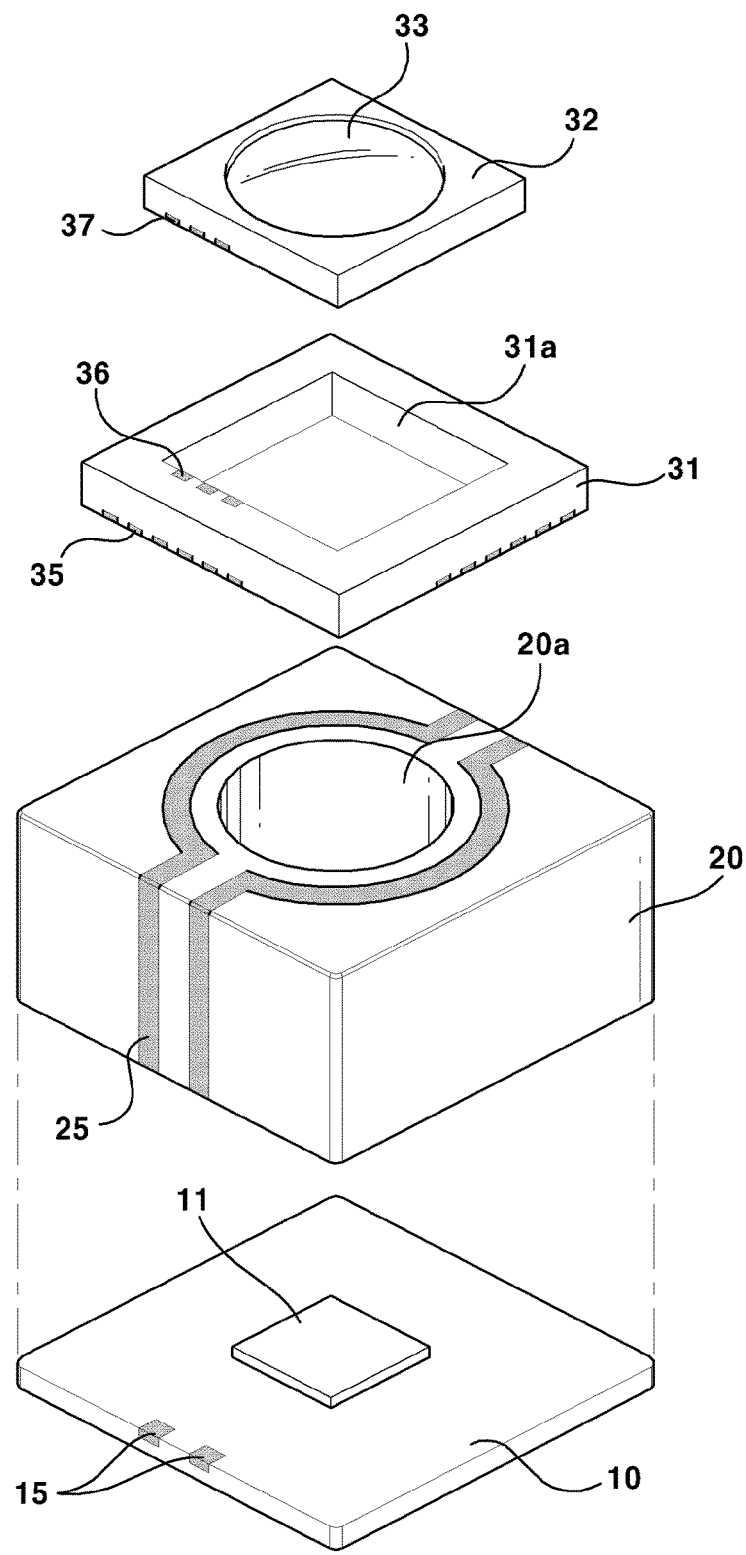
FIG. 2 is a schematic exploded perspective view of FIG. 1.
Figure 3:
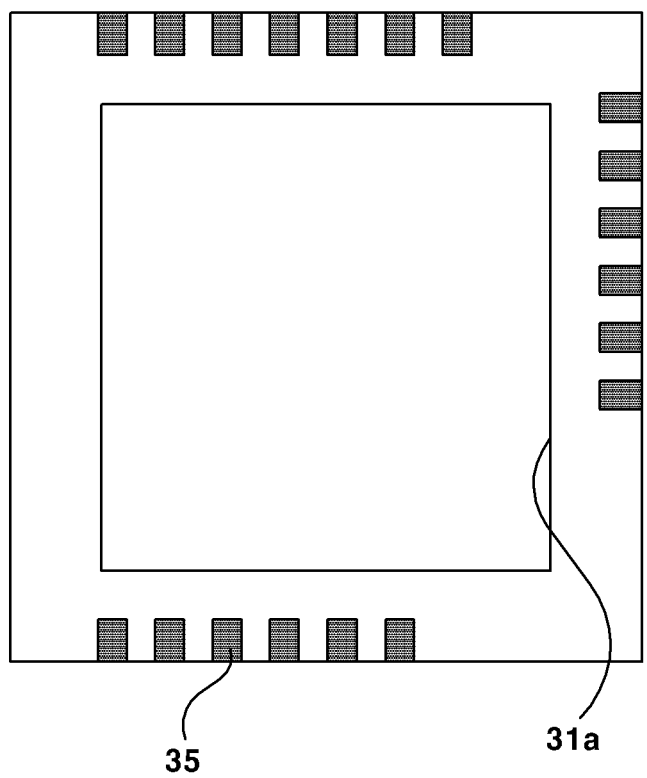
FIG. 3 is a plan view illustrating a bottom surface of an actuator substrate of FIG. 1.
Figure 4:
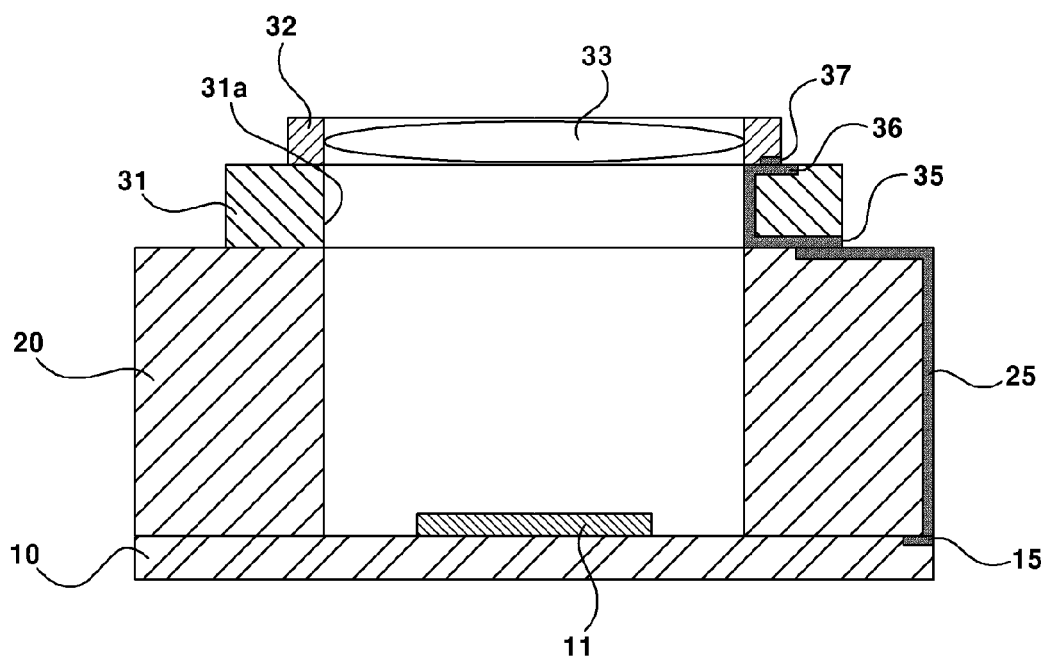
FIGS. 4 and 5 are schematic lateral sectional views of FIG. 1
Figure 5:
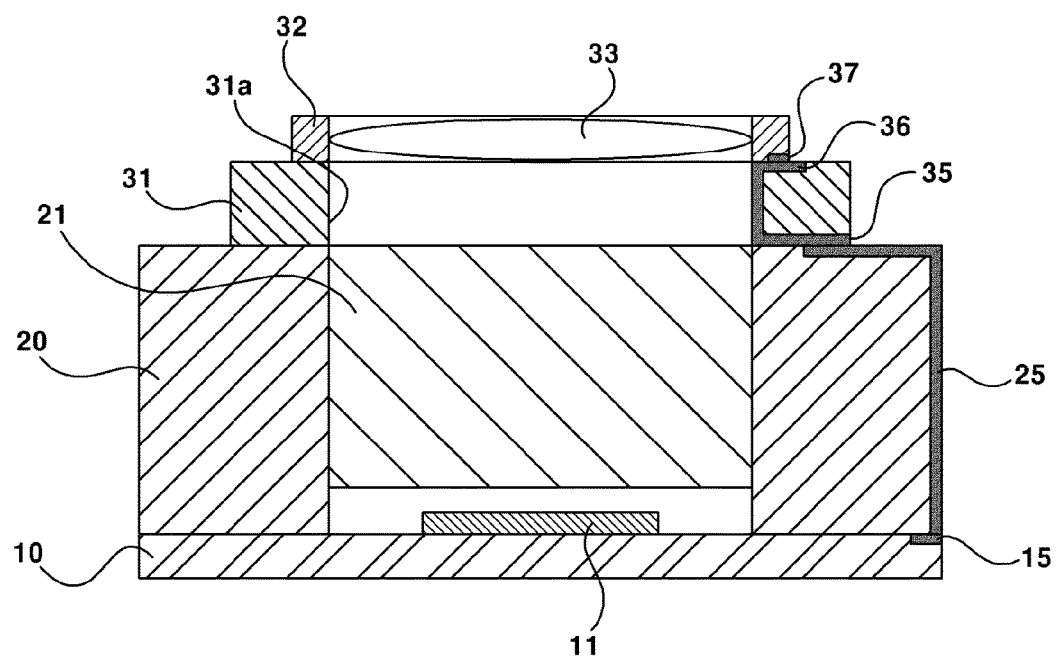

FIG. 1 is a schematic perspective view illustrating a camera module according to an exemplary embodiment of the present disclosure; FIG. 2 is a schematic exploded perspective view of FIG. 1; FIG. 3 is a plan view illustrating a bottom surface of an actuator substrate of FIG. 1; and FIGS. 4 and 5 are schematic lateral sectional views of FIG. 1

As illustrated in the drawings, a camera module according to an exemplary embodiment of the present disclosure may include a PCB (Printed Circuit Board) (10), a housing (20) coupled to an upper portion of the PCB (10), a conductive pattern (25) formed at a surface of the housing (20), and an actuator unit (30) arranged at the housing (20).

The actuator unit (30) may include an actuator substrate (31) coupled to an upper portion of the housing (20) and an actuator module (32) mounted the actuator substrate (31). As occasion demands, a shield can (not illustrated) may be installed outside of the housing (20).

In addition, the camera module according to an exemplary embodiment of the present disclosure may include a first terminal portion (15) formed at the PCB (10) and electrically connected to the conductive pattern (25) of the housing (20), a second terminal portion (35) formed at the electrically connected to the conductive pattern (25) of the housing (20), a third terminal portion (36) formed at the actuator substrate (31) and electrically connected to the actuator module (32), and a fourth terminal portion (37) formed at the actuator module (32) and electrically connected to the third terminal portion (36). Through such structural feature of the present disclosure, the actuator unit (30) may contact by being coupled to an upper portion of the housing (20) and may be conductively connected to the PCB (10) through the conductive pattern (25).

An image sensor (11) may be mounted at the PCB (11), and a plurality of the first terminal portion (15) may be provided at the PCB (11). The first terminal portion (15) may be electrically connected to the actuator unit (30) so as to deliver signals through the conductive pattern (25). Here, the first terminal portion (15) may be conductively connected to the conductive pattern (25) formed at a surface of the housing (20) through a connection portion. The connection portion may be formed of Ag dot-bond, soldering, wire bonding, etc. Any other electrically connectable structure may be employed as the connection portion.

The housing (20) may include a spaced portion formed inside thereof. The image sensor (11) may be accommodated at an internal side of the spaced portion. The housing (20) may be conductively connected to the PCB (10). Such electrical connection may be performed by any one method of SMT (Surface Mount Technology), soldering, Ag bonding, and wire boding.

In addition, at least one lens may be installed at an upper portion of the image sensor (11) in an internal space of the housing (20). In addition, the conductive pattern (25) may be formed at a surface of the housing (20). According to an exemplary embodiment of the present disclosure, the conductive pattern (25) may be formed to include a wiring pattern in a certain shape.

A through-hole (20a) may be formed at a position corresponding to the lens (33) (see FIG. 2) installed at the actuator unit (30) at a center of the housing (20). As illustrated in FIG. 4, an optical path may be formed without any lens at an internal side of the through-hole (20a). Alternatively, a plurality of lenses (21) may be installed at the internal side of the through-hole (20a).

The technology for forming the conductive pattern (25) may be categorized as three methods.

At first, the first method is a patterning method through a double formation, which is a method to injection-mold a portion forming the housing (20) and a portion forming the conductive pattern (25) as synthetic resin made of materials different from each other. According to such method, the housing (20) is injected as an insulator material, and the part forming the conductive pattern (25) is injected using a conductive synthetic resin. Alternatively, the part forming the conductive pattern (25) may be injected using a synthetic resin which is easily capable of being plated with metal, and after the housing (20) is injection-molded, the conductive pattern (25) may be completed by a following process such as plating work.

According to the second method, the housing (20) may be injection-molded while the material forming the housing (20) includes foreign matters reacting to light and heat, and the injection-molded housing (20) is subjected to patterning work such as laser exposer, thereby an wiring pattern is formed at a position where the conductive patter (25) is to be formed. Once the conductive pattern (25) is formed by such process, the conductive pattern (25) itself has a conductive property. Therefore, an SMD (Surface Mount Device) or an electronic component can be directly mounted at the conductive pattern (25).

The third method is a method for patterning by etching a non-circuit part. According to the third method, the whole surfaces of the housing (20) are metalized, then only the part to form the conductive pattern (25) is left while the rest part is etched to integrally form the conductive pattern (25) on a surface of the housing (20).

Meanwhile, the conductive pattern (25) provided by such technology as described in the above may be formed at one side surface an exposed external side surface and an unexposed internal side surface of the housing (20), or may be formed at both side surfaces of the housing (20), as occasion demands. This is to select arrangement of the conductive pattern (25) as formed at a single side or both sides by the extent of requirement for wiring, in order for component mounting. Therefore, when a number of electronic components are required to be mounted, the conductive pattern (25) may be formed by the process as described in the above at a surface side as well as a reverse side of the housing (20), and the components may be installed at the conductive pattern (25).

Such conductive pattern (25) installed at a surface of the hosing (20) has an advantage of reducing installation space required for installing the components, when assembling an electronic device which is in trend of miniaturization.

In addition, although not illustrated in the drawings, in addition to the camera module having an actuator according to an exemplary embodiment of the present disclosure, any electronic device using a separate PCB may include an electric circuit integrally formed with an injection-molded body. In such case, an SMD or an electronic component may be coupled and arranged at the circuit pattern formed on the injection-molded body. When the electronic components are composed by such procedure, a process to produce and combine a separate PCB is not required, and thereby the inconvenience of coupling the PCB to the component body and connecting with wire may be removed. Therefore, the manufacturing cost may be reduced, because the number of components required is reduced.

The actuator unit (30) may perform at least one of auto focus function and handshake prevention function. As illustrated in FIGS. 1 to 4, the actuator unit (30) may include an actuator substrate (31), an actuator module (32) and a lens (33). Here, the substrate may include all kinds of substrates having a wiring pattern such as a printed circuit board, a ceramic base material, a flexible printed circuit board, etc.

As illustrated in FIG. 2, the actuator substrate (31) may include at a center thereof a window (31a) in a shape corresponding to that of the actuator module (32). A second terminal portion (35) may be formed at a bottom surface facing the housing (20), and a third terminal portion (36) may be formed at an upper surface facing the actuator module (32). Here, as illustrated in FIG. 4, the second and the third terminal portions (35)(36) may be connected to each other through a via hole piercing the upper and the lower surface.

In addition, the second terminal portion (35) may be electrically connected to the conductive pattern (25) by being directly connected to the conductive pattern (25). Such electrical connection may be completed using any one method of SMT, soldering, Ag bonding, and wire boding.

In addition, the third terminal portion (36) is provided in order to be connected to the actuator module (32). The third terminal portion (36) may be disposed at a position corresponding to that of a fourth terminal portion (37) (to be described hereinafter) provided along with the second terminal portion (35) at the actuator module (32), and may be electrically connected to the fourth terminal portion (37) by being directly connected to the fourth terminal portion (37). Such electrical connection may be completed using any one method of SMT, soldering, Ag bonding, and wire boding.

As illustrated in FIGS. 1 and 2, the actuator substrate (32) may be formed to be a single module by being directly mounted at an upper surface of the actuator substrate (31). And as described in the above, the fourth terminal portion (37) may be installed at a position corresponding to that of the third terminal portion (36) to be electrically connected to the third terminal portion (36).

The actuator module (32) may be provided in various shapes such as micro actuator, silicon actuator, voice coil motor, etc., and may be applied in a various ways such as capacitive method, electrostatic method, etc. According to an exemplary embodiment of the present disclosure, the actuator module (32) may be formed by a micro process and may be mounted at the actuator substrate (31) by methods such as SMT, soldering, Ag wiring, etc. Alternatively, the actuator module (32) and the actuator substrate (31) may be integrally formed.

According to an exemplary embodiment of the present disclosure, the actuator module (32) may support a lens (33) and move the lens (33) in upward and downward directions to perform auto focus function according to a control signal of a predetermined controller. The actuator module (32) may move the lens (33) in rightward and leftward directions to perform handshake prevention function. The actuator module (33) may move in up-down-right-leftward directions to perform auto focus function and handshake prevention function. In addition, the actuator module (32) may support more than two lenses (33).

Once the actuator unit is composed in such structure as described in the above, the actuator module (32) for up/down/shift/tilt-controlling a lens with respect to an optical axis may be formed by being modularized. Therefore, the manufacturing process of the camera module may be simplified.

Meanwhile, a shield can or a cover housing may be additionally installed at an external side surface of the housing (20). The shield can or cover housing may be formed in a steel (SUS) material to block electromagnetic wave flowing in/out of the camera module, and may prevent foreign matters introduced in the camera module. In addition, the shield can or cover housing may include a through hole at a position corresponding to that of the image sensor and the lens. However, the shield can or cover housing may be omitted and replaced by a method such as electromagnetic wave shield coating on an external side surface of the housing (20), as occasion demands.

According to an exemplary embodiment of the present disclosure, the actuator unit (30) may be directly and conductively connected to the conductive pattern (25) integrally formed on a surface of the housing (20). Therefore, the number of components as well as defects during assembly process can be minimized.

In addition, according to an exemplary embodiment of the present disclosure, the structure of the actuator unit (30) is improved so that the actuator module (32) having at least one of auto focus function and handshake prevention function may be directly mounted on the actuator substrate (31) to integrally form a single module which is easily connectable to the PCB (10) through an electric connection between the conductive pattern formed on a surface of the housing (20) and the second terminal portion (35) installed at the actuator substrate (31), thereby the assemblability of the camera module can be enhanced.

The embodiments described in the above and illustrated in drawings shall not be construed as limiting the technical spirit of the present disclosure. The protective scope of the present disclosure is to be limited only by the limitations disclosed in the claims, and a person skilled in the art of the present disclosure would be able to modify or transform the spirit of the present disclosure in various ways. Therefore, such modification or transformation shall be construed as being included within the protective scope of the present disclosure, as long as these modification or transformation would be obvious to those who skilled in the art.

What is claimed is:

1. A camera module comprising:
a Printed Circuit Board (PCB) including a first terminal portion;
a housing coupled to the PCB and including a conductive pattern electrically connected to the first terminal portion; and
an actuator unit arranged at an upper side of the housing and electrically connected to the conductive pattern,
wherein the actuator unit includes an actuator substrate and an actuator module mounted at the actuator substrate, and
wherein the actuator substrate includes, at a position corresponding to that of a lens installed at the actuator module, a window piercing the actuator substrate in a size larger than that of a diameter of the lens.

2. The camera module of claim 1, wherein the actuator unit performs at least one of auto focus function and handshake prevention function.

3. The camera module of claim 1, wherein the actuator module is directly mounted at the actuator substrate.

4. The camera module of claim 1, further comprising:
a second terminal portion formed at the actuator substrate and electrically connected to the conductive pattern;
a third terminal portion formed at the actuator substrate and electrically connected to the actuator module; and
a fourth terminal portion formed at the actuator module and electrically connected to the third terminal portion.

5. The camera module of claim 4, wherein the second terminal portion and the third terminal portion are electrically connected to each other in the actuator substrate.

6. The camera module of claim 1, wherein the housing includes a through-hole formed at a position corresponding to that of the lens and an image sensor.

7. The camera module of claim 1, wherein the actuator substrate and the actuator module are conductively connected to each other by any one of surface-mount technology (SMT), soldering, silver (Ag) bonding, or wire boding.

8. The camera module of claim 1, wherein the actuator substrate and the housing are conductively connected to each other by any one of surface-mount technology (SMT), soldering, silver (Ag) bonding, or wire boding.

9. The camera module of claim 1, wherein the housing and the PCB are conductively connected to each other by any one of surface-mount technology (SMT), soldering, silver (Ag) bonding, or wire boding.

10. The camera module of claim 1, wherein the housing accommodates at least one lens installed inside thereof.

11. The camera module of claim 1, wherein the conductive pattern is formed at one side surface of an external side surface and an internal side surface of the housing.

12. The camera module of claim 1, wherein the conductive pattern is formed at both side surfaces of the housing.

13. A camera module comprising:
a Printed Circuit Board (PCB) including a first terminal portion;
a housing disposed on an upper surface of the PCB;
a lens coupled with the housing;
an actuator substrate disposed on an upper surface of the housing;
an actuator disposed on the actuator substrate; and
a conductive pattern disposed on the housing and the actuator substrate and electrically connected with the PCB and the actuator,
wherein the actuator substrate comprises a window piercing the actuator substrate at a position corresponding to that of the lens, and
wherein the window is formed in a size larger than that of a diameter of a lens coupled at the actuator module.

14. The camera module of claim 13, wherein a portion of the conductive pattern is disposed on an inner lateral surface of the actuator substrate.

15. The camera module of claim 13, wherein the conductive pattern comprises a first conductive pattern disposed on the housing and a second conductive pattern disposed on the actuator substrate,
wherein the first conductive pattern is disposed on an outer lateral surface of the housing and an upper surface of the housing, and
wherein the second conductive pattern is disposed on a bottom surface of the actuator substrate, an inner lateral surface of the actuator substrate and an upper surface of the actuator substrate.

16. The camera module of claim 13, wherein a shape of the window is different from a shape of the lens coupled at the actuator module.

* * * * *